US009847853B1

United States Patent
Patel

(10) Patent No.: US 9,847,853 B1
(45) Date of Patent: Dec. 19, 2017

(54) METHOD AND APPARATUS FOR REDUCED HARQ BUFFER STORAGE

(71) Applicant: MBIT WIRELESS, INC., Newport Beach, CA (US)

(72) Inventor: Bhaskar Patel, San Clemente, CA (US)

(73) Assignee: MBIT WIRELESS, INC., Irvine, CA (US)

( * ) Notice: Subject to any disclaimer, the term of this patent is extended or adjusted under 35 U.S.C. 154(b) by 80 days.

(21) Appl. No.: 15/008,779

(22) Filed: Jan. 28, 2016

(51) Int. Cl.
  *H04L 1/18* (2006.01)
  *H03M 13/09* (2006.01)

(52) U.S. Cl.
  CPC .......... *H04L 1/1812* (2013.01); *H03M 13/09* (2013.01); *H03M 13/095* (2013.01); *H04L 1/1819* (2013.01); *H04L 1/1835* (2013.01)

(58) Field of Classification Search
  CPC ....... H04L 1/18; H04L 1/1812; H04L 1/1819; H04L 1/1829; H04L 1/1832; H04L 1/1835; H03M 13/09; H03M 13/095; H03M 13/6306
  See application file for complete search history.

(56) References Cited

U.S. PATENT DOCUMENTS

| 2003/0133497 A1* | 7/2003 | Kinjo | H04L 1/0041 375/152 |
| 2010/0050034 A1* | 2/2010 | Che | H04L 1/1845 714/748 |

\* cited by examiner

*Primary Examiner* — Albert Decady
*Assistant Examiner* — Christian Dorman
(74) *Attorney, Agent, or Firm* — Lerner, David, Littenberg, Krumholz & Mentlik, LLP

(57) ABSTRACT

Automatic Repeat Request (ARQ) protocol is used in many modern telecommunication systems for improved link level reliability. Hybrid ARQ (HARQ) protocol takes advantage of the retransmissions in ARQ to enable the receiver to decode the currently received data by combining it with all the previously received transmissions that were not successfully decoded. Each successive retransmission improves the probability of correctly decoding the data. To support HARQ, the receiver is required to store the previously received unsuccessful transmissions for combining with future retransmissions. The storage of the previously received unsuccessful transmissions can be very large depending on type of the HARQ protocol used. A method and apparatus are disclosed that enable reduced memory storage requirements while maintaining the HARQ performance requirements. The reduced memory requirements result in reduced cost, reduced power consumption and lowered cost.

18 Claims, 15 Drawing Sheets

METHOD AND APPARATUS FOR REDUCED HARQ BUFFER STORAGE

BACKGROUND

Automatic Repeat Request (ARQ) protocol is used in many modern telecommunication systems for improved link level reliability. ARQ protocol involves two entities A and B as shown in FIG. 1. A block of data exchanged between two entities is referred herein as a packet or data packet. The transmitter of entity A sends a payload data packet with a cyclic redundancy check (CRC). The receiver of entity B decodes the data packet and checks the received CRC against locally computed CRC to determine whether the received data packet is correct. If the data packet is correctly received, the entity B sends a positive acknowledgement (ACK) using its transmitter. If the received data packet has errors, the entity B sends a negative acknowledgement (NACK) using its transmitter. Based on the status of the acknowledgement (ACK or NACK) obtained by receiver of entity A, it may determine whether to send a new data packet or retransmit the data packet that was not received correctly by the entity B. The process of NACK and retransmissions may continue for several attempts until either the data packet is successfully received or maximum allowed retransmissions have been attempted.

Hybrid ARQ (HARQ) protocol takes advantage of the retransmissions in ARQ to enable the receiver to make decoding of the currently received data packet by combining it with all the previously received transmissions of the same data packet that were not successfully decoded. An example of HARQ protocol is illustrated in FIG. 2. This enables the receiver to take advantage of all the received information in current as well as previously received transmissions for the same data packet. Each successive retransmission improves the probability of correctly decoding the data packet.

For the receiver to be able to combine the information from different transmissions of the same data packet, the receiver must know a priori that a data packet being received at any given time corresponds to a new data packet transmission or retransmission of a previously unsuccessfully received data packet. The HARQ protocol may have provisions to provide the required information for this purpose. For example, each data packet may be identified by a sequence number. Furthermore, the sequence number of the data packet may be provided separately, for example as a header for a data packet as illustrated in FIG. 1. The header carrying the sequence number for a data packet may be encoded or transmitted in a manner such that it has much higher reliability than the payload data packet transmission. Similarly, the ACK/NACK message may include the sequence number of the data packet being ACKed or NACKed. Similar to the header, the ACK/NACK may be encoded or transmitted in a manner such that it has much higher reliability than the payload data packet transmission. The sequence number of a data packet enables the receiver to uniquely identify a data packet from a group of data packets to correctly combine the received information from different transmissions of the same data packet.

One of the key requirements for a receiver to support HARQ is the ability to store the previously received unsuccessful transmissions for combining with future retransmissions. The storage of the previously received unsuccessful transmissions can be very large depending on the exact details of the HARQ protocol used. For example, in case of $3^{rd}$ Generation Partnership Project (3GPP) Long Term Evolution (LTE) wireless communication system, the storage requirements are specified depending on the category of the User Equipment (UE). For example, a Category-4 UE is required to store 1827072 "soft channel bits." The term "soft" in the phrase "soft channel bits" refers to the confidence level for each received bit being either logic '0' or logic '1'. The soft channel bits are also referred to as Log Likelihood Ratio (LLR). The term "channel bits" in the phrase "soft channel bits" refers to the received demodulated bits but before performing Forward Error Correction (FEC) decoding.

In general, the LLRs can have wide dynamic range. To limit the bit width and therefore to limit the complexity of FEC decoding and also to limit the storage requirements for HARQ, the LLRs may be quantized. Each quantized value may be represented by a codeword consisting of few bits. For example, each quantized LLR value may be represented by 4, 5, or 6 bits. Considering the case of 6 bits per LLR value, the total storage requirement for LTE Category-4 UE is 6*1827072=10962432 bits. This is a significant amount of memory requirement.

In 3GPP LTE wireless communication system, each block of payload data, called Transport Block, is transmitted every subframe of 1 ms duration. A Transport Block is made up of a number of Code Blocks as shown in FIG. 3. Each Code Block is encoded such that it can be independently decoded by the receiver. All the Code Blocks must be successfully decoded to be able to decode a Transport Block. For each Code Block that is not decoded successfully, the UE may save the LLRs for that Code Block in the HARQ LLR buffer. The receiver of a UE sends a NACK if a Transport Block is not decoded successfully. As per 3GPP LTE specifications, the transmitter at a base station, known as evolved Node B (eNB), may retransmit the entire Transport Block. This is true even if some Code Blocks are successfully decoded by the receiver during earlier transmissions. When processing the retransmitted Transport Block, the receiver in the UE may need to retrieve the saved LLRs and combine them with the LLRs computed from the currently received data. The combining operation may be performed on per Code Block basis. The Code Blocks that may have been already decoded successfully during earlier transmissions need not be processed by the UE receiver.

In order to allow for receiver processing delay, the ACK/NACK may be transmitted some time after the actual time instant at which the data packet may be transmitted. Similarly, when the ACK/NACK is received by the transmitting entity, the retransmission may be sent some time after the actual reception of the ACK/NACK. In 3GPP LTE wireless communication system, the ACK/NACK is transmitted at least four subframes (4 ms) after the reception of the Transport Block. The eNB may send the retransmissions, at the earliest, four subframes after receiving the ACK/NACK status from the UE. Therefore, in case of 3GPP LTE wireless communication system, as illustrated in FIG. 4, there is a gap of at least 8 subframes (8 ms) between initial transmission and subsequent retransmissions. This duration is also known as HARQ Round Trip Time (RTT). In FIG. 4, Redundancy Version (RV) refers to the different versions of the encoded Transport Block that may be used for retransmissions.

If the eNB and UE were to cease transmission until one Transport Block is successfully decoded, the throughput of the system may be significantly reduced. Therefore, the HARQ protocol in 3GPP LTE wireless communication system allows transmission of multiple Transport Blocks before requiring retransmissions of previously transmitted Transport Blocks. Specifically, the 3GPP LTE Frequency Division Duplex (FDD) wireless communication system allows eight new transmissions before waiting for retransmissions as illustrated in FIG. 5. This requires that the UE should be able to store the LLRs for up to eight Transport Blocks. The total storage of 10962432 bits mentioned above is for the cumulative of all eight Transport Blocks.

SUMMARY

A method and apparatus are disclosed to reduce the HARQ LLR buffer storage while still able to handle the worst case scenario and maintaining HARQ decoding performance.

In accordance with an aspect of the present disclosure, a method may store, in a memory, Log Likelihood Ratios (LLR) for a Hybrid Automatic Repeat Request (HARQ) protocol in a communication system, wherein the memory has a size (i) less than a maximum size required by the HARQ protocol for a worst case Transport Block decoding condition at a communication device of the communication system, (ii) satisfying Transport Block Error (BLER) rate and throughput performance of the HARQ protocol, and (iii) to store all transmissions of initial Redundancy Versions (RV0) respectively for a predetermined number of Transport Blocks, and in which the RV0 transmissions respectively for the predetermined number of Transport Blocks include less than all systematic bits of the predetermined number of Transport Blocks. The method may include controlling, by a processing device, decoding of a first Code Block of a first Transport Block of the Transport Blocks by combining an LLR of a RV0 of the first Code Block of the first Transport Block for which decoding was unsuccessful with an LLR of a currently retransmitted Redundancy Version (RVI) of the first Code Block of the first Transport Block, in which the LLR of the RV0 of the first Code Block of the first Transport Block is stored in a first position of the memory corresponding to the first Transport Block, when the decoding of the first Code Block of the first Transport Block by the combining is unsuccessful, generating a redundancy check failure indication and transmitting a negative acknowledgement (NACK) to a base station of the system from which Redundancy Versions of the Code Blocks respectively of the Transport Blocks are transmitted, when space in the memory for storing the LLR of the RVI of the first Code Block of the first Transport Block is not available and a newly received LLR of the first Transport Block is from a Redundancy Version (RV) different from an RV for the first Transport Block stored in the memory, the newly received LLR of the first Transport Block not to be stored in the memory, when the newly received LLR of the first Transport Block is from a same RV as a given RV for the first Transport Block having a given LLR thereof stored in the memory, storing a result of combining the newly received LLR for the first Transport Block with the given LLR for the first Transport Block stored in the memory, at a position in the memory at which the given LLR corresponding to the first Transport Block is stored, and when decoding for the first Transport Block is successful, releasing the first position in the memory corresponding to the first Transport Block.

In one alternative, the decoding of the Code Blocks respectively of the Transport Blocks may include a cyclic redundancy check (CRC).

In one alternative, the method may include controlling, by the processing device, when the first position in the memory corresponding to the first Transport Block has been released and a second position in the memory corresponding to a second Transport Block of the Transport Blocks is full, storing a currently retransmitted RVI for the second Transport Block in the first position in the memory.

In one alternative, the method may include controlling, by the processing device, the decoding of the first Code Block of the first Transport Block by combining the LLR of the RV0 of the first Code Block of the first Transport Block for which decoding was unsuccessful with the LLR of the currently retransmitted (RVI) of the first Code Block of the first Transport Block and an LLR of each previously retransmitted RVI of the first Code Block of the first Transport Block, in which the LLR of each previously retransmitted RVI of the first Code Block of the first Transport Block is stored at a respective position in the memory.

In one alternative, the method may include controlling, by the processing device, when a given position in the memory corresponding to a given Transport Block of the Transport Blocks has a size configured to store initial offset Systematic bits external to an RV0 for the given Transport Block and a retransmission RVI for the given Transport Block including the initial offset Systematic bits is received, storing an LLR for the initial offset Systematic bits in the given position in the memory corresponding to the given Transport Block which is storing an LLR for the RV0 of the given Transport Block.

In one alternative, the size of the memory may be determined according to a highest code rate for the communication system, and the communication system may be a $3^{rd}$ Generation Partnership Project (3GPP) Long Term Evolution (LTE) wireless communication system.

In accordance with an aspect of the present disclosure, an apparatus may store, in a memory, Log Likelihood Ratios (LLR) for a Hybrid Automatic Repeat Request (HARQ) protocol in a communication system, wherein the memory has a size (i) less than a maximum size required by the HARQ protocol for a worst case Transport Block decoding condition at a communication device of the communication system, (ii) satisfying Transport Block Error (BLER) rate and throughput performance of the HARQ protocol, and (iii) to store all transmissions of initial Redundancy Versions (RV0) respectively for a predetermined number of Transport Blocks, and in which the RV0 transmissions respectively for the predetermined number of Transport Blocks include less than all systematic bits of the predetermined number of Transport Blocks. The apparatus may include circuitry configured to control: decoding of a first Code Block of a first Transport Block of the Transport Blocks by combining an LLR of a RV0 of the first Code Block of the first Transport Block for which decoding was unsuccessful with an LLR of a currently retransmitted Redundancy Version (RVI) of the first Code Block of the first Transport Block, in which the LLR of the RV0 of the first Code Block of the first Transport Block is stored in a first position of the memory corresponding to the first Transport Block, when the decoding of the first Code Block of the first Transport Block by the combining is unsuccessful, generating a redundancy check failure indication and transmitting a negative acknowledgement (NACK) to a base station of the system from which Redundancy Versions of the Code Blocks respectively of the Transport Blocks are transmitted, when space in the memory for storing the LLR of the RVI of the first Code Block of the first Transport Block is not available and a newly received LLR of the first Transport Block is from a Redundancy Version (RV) different from an RV for the first Transport Block stored in the memory, the newly received LLR of the first Transport Block not to be stored in the memory, when the newly received LLR of the first Transport Block is from a same RV as a given RV for the first Transport Block having a given LLR thereof stored in the memory, storing a result of combining the newly received LLR for the first Transport Block with the given LLR for the first Transport Block stored in the memory, at a position in the memory at which the given LLR corresponding to the first Transport Block is stored, and when decoding for the first Transport Block is successful, releasing the first position in the memory corresponding to the first Transport Block.

In one alternative of the apparatus, the decoding of the Code Blocks respectively of the Transport Blocks may include a cyclic redundancy check (CRC).

In one alternative of the apparatus, the circuitry may be configured to control, when the first position in the memory corresponding to the first Transport Block has been released and a second position in the memory corresponding to a second Transport Block of the Transport Blocks is full, storing a currently retransmitted RVI for the second Transport Block in the first position in the memory.

In one alternative of the apparatus, the circuitry may be configured to control the decoding of the first Code Block of the first Transport Block by combining the LLR of the RV0 of the first Code Block of the first Transport Block for which decoding was unsuccessful with the LLR of the currently retransmitted (RVI) of the first Code Block of the first Transport Block and an LLR of each previously retransmitted RVI of the first Code Block of the first Transport Block, in which the LLR of each previously retransmitted RVI of the first Code Block of the first Transport Block is stored at a respective position in the memory.

In one alternative of the apparatus, the circuitry may be configured to control, when a given position in the memory corresponding to a given Transport Block of the Transport Blocks has a size configured to store initial offset Systematic bits external to an RV0 for the given Transport Block and a retransmission RVI for the given Transport Block including the initial offset Systematic bits is received, storing an LLR for the initial offset Systematic bits in the given position in the memory corresponding to the given Transport Block which is storing an LLR for the RV0 of the given Transport Block.

In one alternative of the apparatus, the size of the memory may be determined according to a highest code rate for the communication system, and the communication system may be a $3^{rd}$ Generation Partnership Project (3GPP) Long Term Evolution (LTE) wireless communication system.

In accordance with an aspect of the present disclosure, a communication device may include a receiver to receive a signal in a communication system; and a processing device to control storing, in a memory, Log Likelihood Ratios (LLR) for a Hybrid Automatic Repeat Request (HARQ) protocol in the communication system, wherein the memory has a size (i) less than a maximum size required by the HARQ protocol for a worst case Transport Block decoding condition at the communication device, (ii) satisfying Transport Block Error (BLER) rate and throughput performance of the HARQ protocol, and (iii) to store all transmissions of initial Redundancy Versions (RV0) respectively for a predetermined number of Transport Blocks, and in which the RV0 transmissions respectively for the predetermined number of Transport Blocks include less than all systematic bits of the predetermined number of Transport Blocks. The processing device may be configured to control: decoding of a first Code Block of a first Transport Block of the Transport Blocks by combining an LLR of a RV0 of the first Code Block of the first Transport Block for which decoding was unsuccessful with an LLR of a currently retransmitted Redundancy Version (RVI) of the first Code Block of the first Transport Block, in which the LLR of the RV0 of the first Code Block of the first Transport Block is stored in a first position of the memory corresponding to the first Transport Block, when the decoding of the first Code Block of the first Transport Block by the combining is unsuccessful, generating a redundancy check failure indication and transmitting a negative acknowledgement (NACK) to a base station of the system from which Redundancy Versions of the Code Blocks respectively of the Transport Blocks are transmitted, when space in the memory for storing the LLR of the RVI of the first Code Block of the first Transport Block is not available and a newly received LLR of the first Transport Block is from a Redundancy Version (RV) different from an RV for the first Transport Block stored in the memory, the newly received LLR of the first Transport Block not to be stored in the memory, when the newly received LLR of the first Transport Block is from a same RV as a given RV for the first Transport Block having a given LLR thereof stored in the memory, storing a result of combining the newly received LLR for the first Transport Block with the given LLR for the first Transport Block stored in the memory, at a position in the memory at which the given LLR corresponding to the first Transport Block is stored, and when decoding for the first Transport Block is successful, releasing the first position in the memory corresponding to the first Transport Block.

In one alternative of the communication device, the decoding of the Code Blocks respectively of the Transport Blocks may include a cyclic redundancy check (CRC).

In one alternative of the communication device, the circuitry may be configured to control, when the first position in the memory corresponding to the first Transport Block has been released and a second position in the memory corresponding to a second Transport Block of the Transport Blocks is full, storing a currently retransmitted RVI for the second Transport Block in the first position in the memory.

In one alternative of the communication device, the circuitry may be configured to control the decoding of the first Code Block of the first Transport Block by combining the LLR of the RV0 of the first Code Block of the first Transport Block for which decoding was unsuccessful with the LLR of the currently retransmitted (RVI) of the first Code Block of the first Transport Block and an LLR of each previously retransmitted RVI of the first Code Block of the first Transport Block, in which the LLR of each previously retransmitted RVI of the first Code Block of the first Transport Block is stored at a respective position in the memory.

In one alternative of the communication device, the circuitry may be configured to control, when a given position in the memory corresponding to a given Transport Block of the Transport Blocks has a size configured to store initial offset Systematic bits external to an RV0 for the given Transport Block and a retransmission RVI for the given Transport Block including the initial offset Systematic bits is received, storing an LLR for the initial offset Systematic bits in the given position in the memory corresponding to the given Transport Block which is storing an LLR for the RV0 of the given Transport Block.

In one alternative of the communication device, the size of the memory may be determined according to a highest code rate for the communication system, and wherein the communication system may be a $3^{rd}$ Generation Partnership Project (3GPP) Long Term Evolution (LTE) wireless communication system.

DETAILED DESCRIPTION

Figure 1:
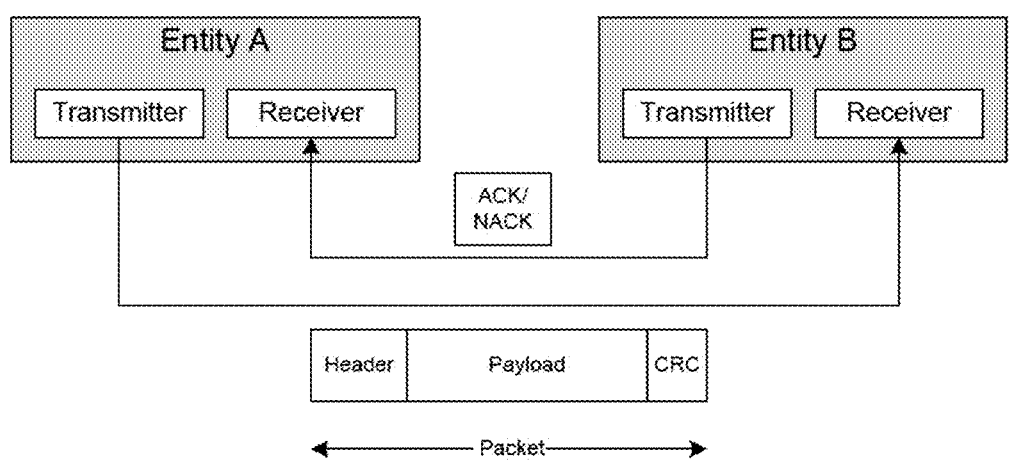
FIG. 1 illustrates the use of Automatic Repeat Request (ARQ) protocol between two entities.
Figure 2:
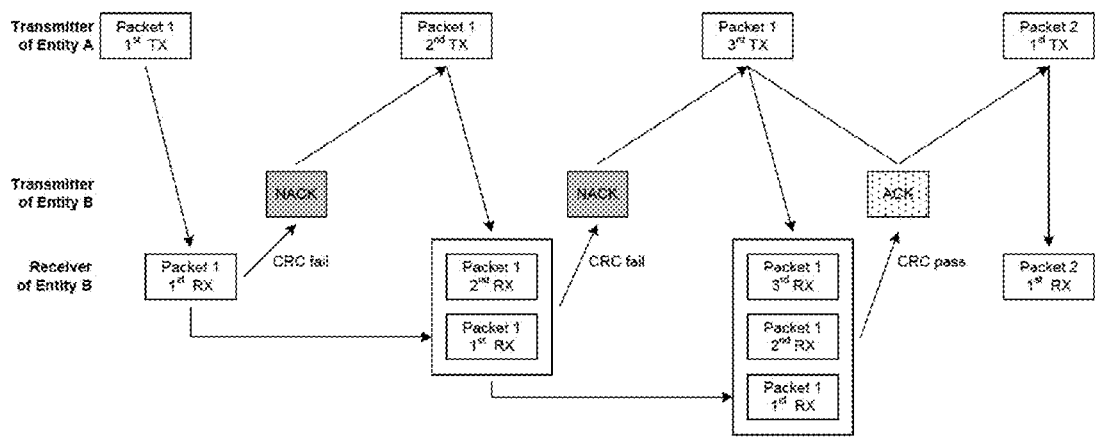
FIG. 2 illustrates an example operation of Hybrid ARQ (HARQ) protocol between two entities.
Figure 3:
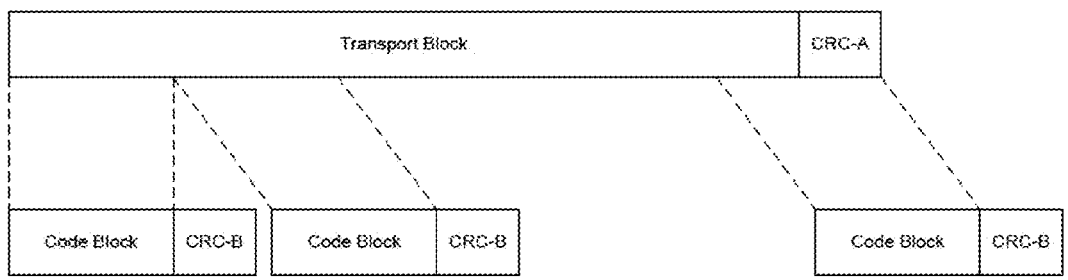
FIG. 3 illustrates segmentation of a Transport Block into multiple Code Blocks and CRC insertion.
Figure 4:
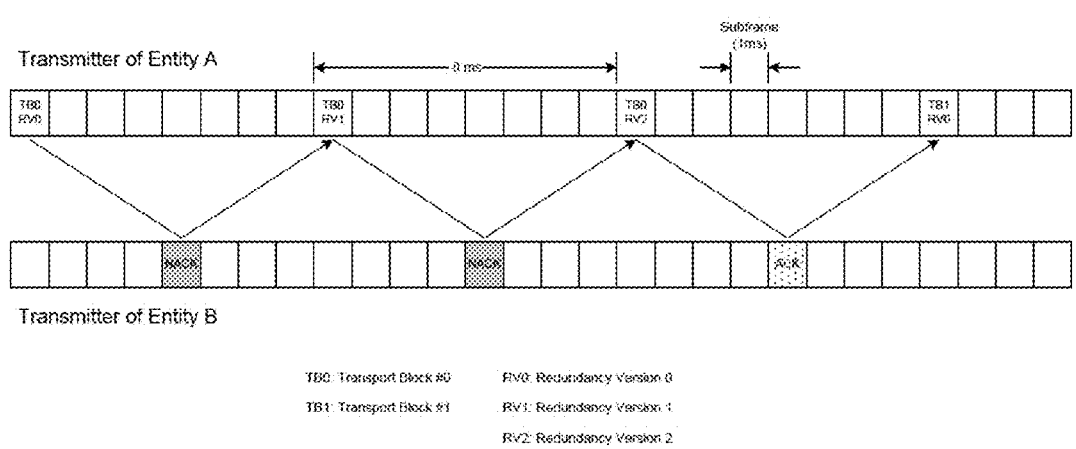
FIG. 4 illustrates an example operation of HARQ protocol between two entities with Round Trip Time (RTT) delay.

The foregoing aspects, features and advantages of the present disclosure will be further appreciated when considered with reference to the following description of exemplary embodiments and accompanying drawings, wherein like reference numerals represent like elements. In describing the exemplary embodiments of the disclosure illustrated in the appended drawings, specific terminology will be used for the sake of clarity. However, the disclosure is not intended to be limited to the specific terms used.

Figure 6:
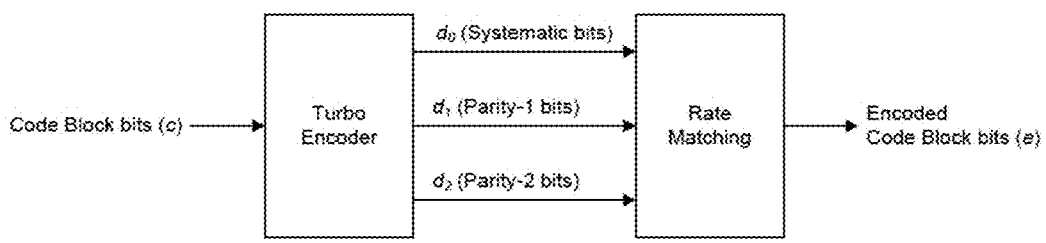
FIG. 6 illustrates Turbo Encoding and Rate Matching block diagram in case of 3GPP LTE wireless communication system.

In 3GPP LTE wireless communication system, a Turbo code with "mother" code of rate 1/3 is used for Forward Error Correction (FEC) of payload data transmission as shown in FIG. 6. The code rate of an FEC code refer to the ratio of number of payload bits divided by the total number of payload bits and parity bits which may be added by the FEC. Therefore, in case of 3GPP LTE wireless communication system, for each payload bit there are two parity bits leading to code rate of 1/3. The first set of parity bits are referred herein as Parity-1 bits. The second set of parity bits are referred herein as Parity-2 bits. The payload bits may be output as is and may be referred to as Systematic bits.

The actual code rate used for initial transmission may be decided by eNB depending on the prevailing signal conditions. Different code rates are achieved by the Rate Matching function as shown in FIG. 6. The Rate Matching function may puncture some of the bits to increase the code rate above the mother code rate of 1/3. The Rate Matching function may repeat some of the bits to decrease the code rate below the mother code rate of 1/3.

Figure 7:
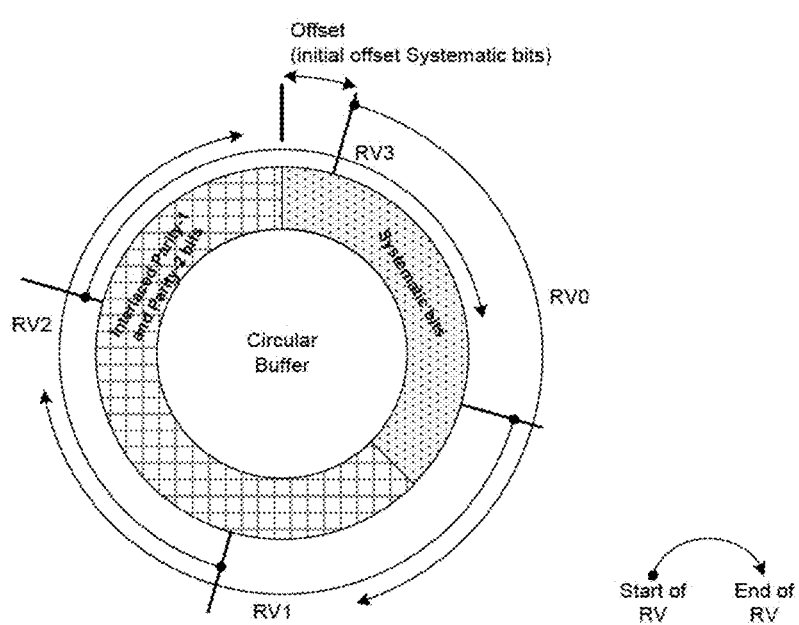
FIG. 7 illustrates example Rate Matching operation using circular buffers and Redundancy Versions in case of 3GPP LTE wireless communication system.

The Rate Matching function may be implemented as a circular buffer as shown in FIG. 7. In 3GPP LTE wireless communication system, the circular buffer is divided into four equal parts as shown in FIG. 7. Each part of the buffer is referred as Redundancy Version (RV). For an initial transmission, the RV0 is always used. Note that the RV0 starts after a small offset from the beginning of the circular buffer and it includes at least a portion of the Parity-1 and Parity-2 bits. This ensures that the RV0 can be decoded independently without combining with any other RVs. Also note that depending on the exact resource allocation by eNB the different RV may overlap at least partially as shown in FIG. 7.

When a retransmission is required for the same payload data, the Rate Matching function may send a different RV, e.g., RV1, RV2, or RV3. At the receiver, the bits received from different transmissions may be combined and then the Turbo decoding may be performed for improved decoding probability. In the present context the term combining mean two things. First, for the bits received in different RV but are overlapping as illustrated in FIG. 7, the LLR value of those bits may be added together and saturated to ensure that the added value remains within the bitwidth of the LLR bits. In some implementations, the overlapping bits may be averaged. Second, for the received bits that are not overlapping and are disjoint, the received bits are used as is without any addition or averaging with bits from other RVs. With each additional received RV, the decoder has more parity bits and therefore the code rate is decreased which may improve decoding performance.

Figure 5:
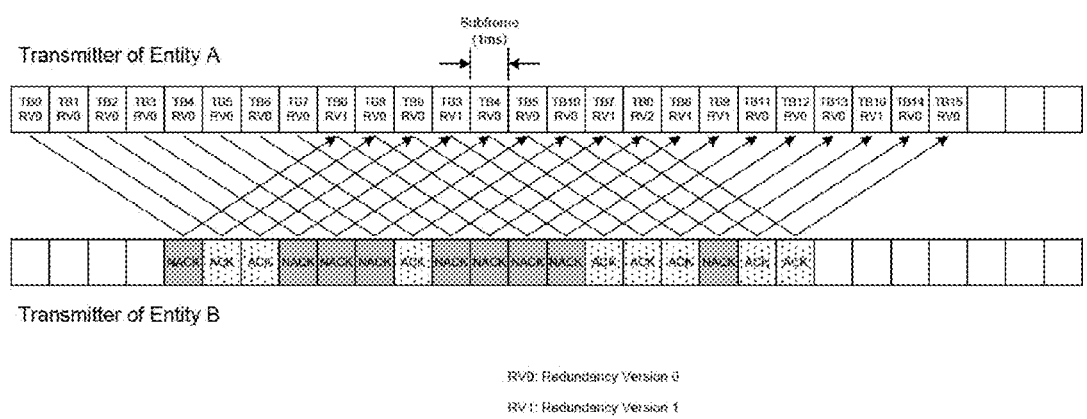
FIG. 5 illustrates an example operation of HARQ protocol between two entities with Round Trip Time (RTT) delay and transmission of multiple Transport Blocks before receiving acknowledgement.

The maximum throughput in a 3GPP LTE wireless communication system is achieved when the code rate used for transmission is high, for example 0.92. This means that the number of redundant bits in a Code Block is small. For initial Transport Block transmission, only a subset of coded bits is used. This is achieved by the Rate Matching function puncturing most of the bits. This is also referred to as Redundancy Version (RV). The particular subset, i.e., RV to be used, is determined by the eNB. As shown in FIG. 5, a different subset of bits is transmitted for each new transmission and retransmissions, if any. Therefore, even though the initial code rate may be high, after retransmissions, the code rate may become lower. As per 3GPP LTE wireless communication system specification, the lowest code rate allowed for high throughput scenarios, even after retransmissions, is rate 2/3 (excluding repetitions). This means that at most about 50% redundancy is added by the FEC encoder at the eNB. For 3GPP LTE wireless communication system, the highest code rate for initial Code Block transmissions is approximately 0.92. Therefore, a single retransmission can bring the effective code rate below the lowest code rate used.

In other words, with a single retransmission, all the coded bits in a circular buffer may be received when operating in the highest throughput scenario.

Statistical analysis has shown that the probability of all Transport Blocks within the minimum HARQ RTT window being in error simultaneously may be extremely low. Furthermore, even when all the Transport Blocks within the minimum HARQ RTT window may be in error, the probability that all Code Blocks of all Transport Blocks within HARQ RTT window may be in error is extremely low. Furthermore, the likelihood of the eNB allocating all the resources (e.g., entire bandwidth) to a single UE over the entire minimum HARQ RTT window is small. However, it is essential to be able to support the worst case scenario even though it may be extremely unlikely.

Figure 8:
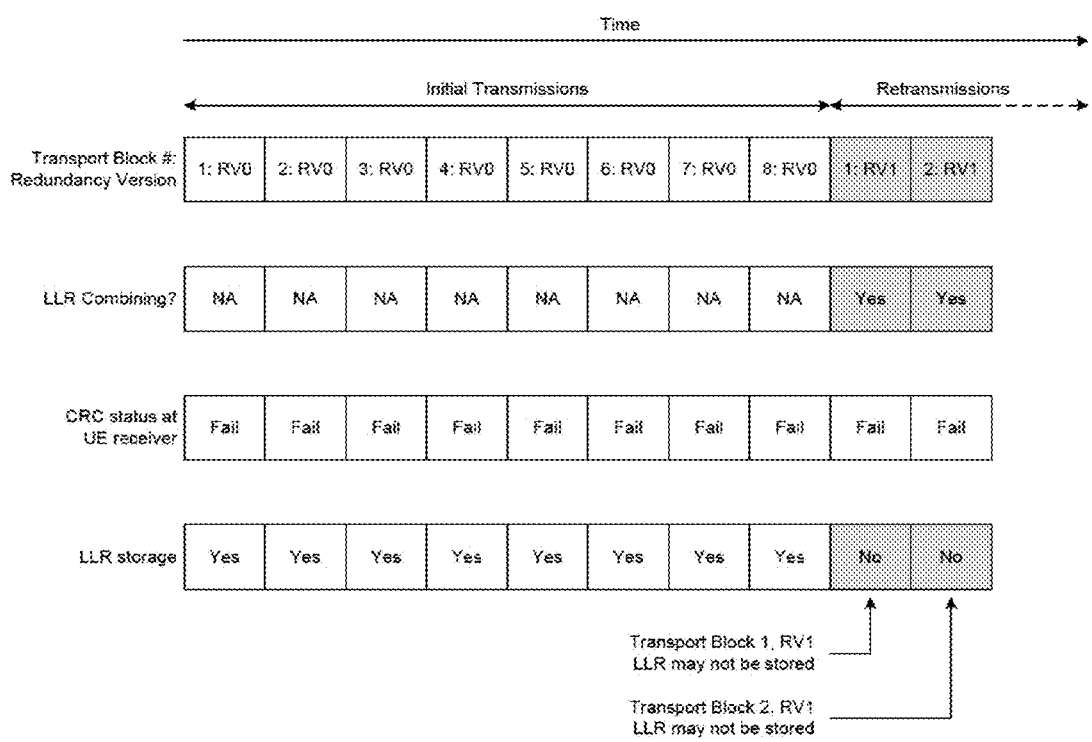
FIG. 8 illustrates an example operations performed at UE receiver when the buffer is full and still combining is performed with non-RV0 retransmissions according to aspects of the present disclosure.
Figure 9:
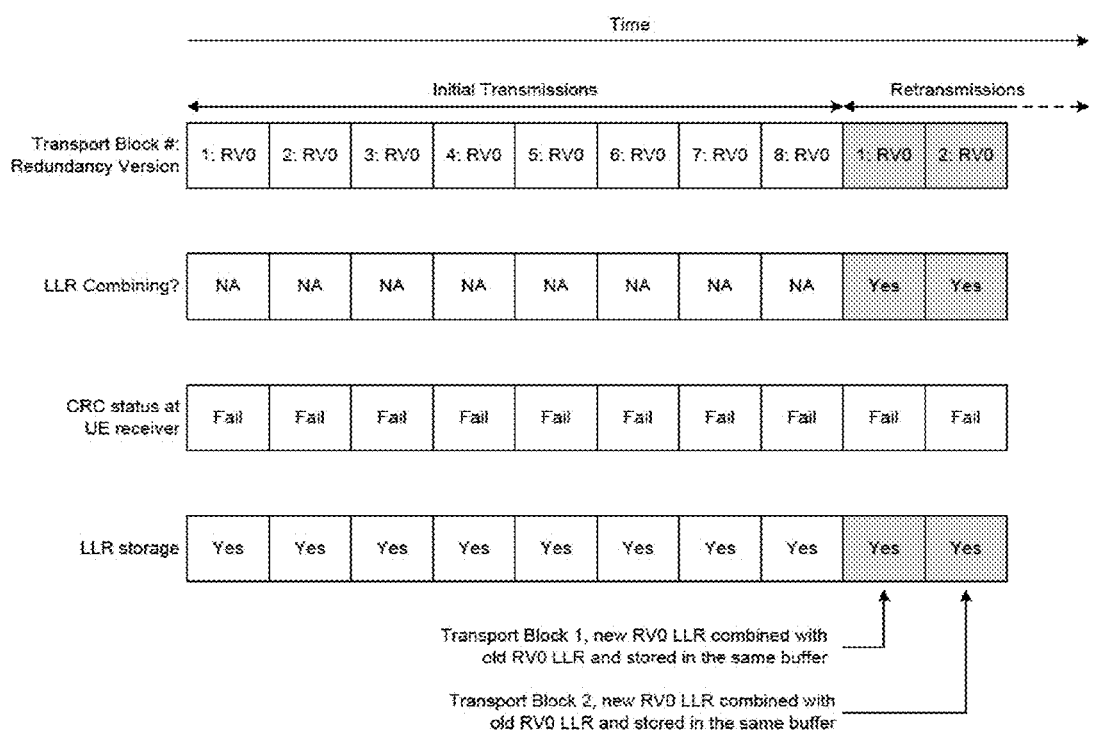
FIG. 9 illustrates an example operations performed at UE receiver when the buffer is full and still combining is performed with RV0 retransmissions according to aspects of the present disclosure.
Figure 10:
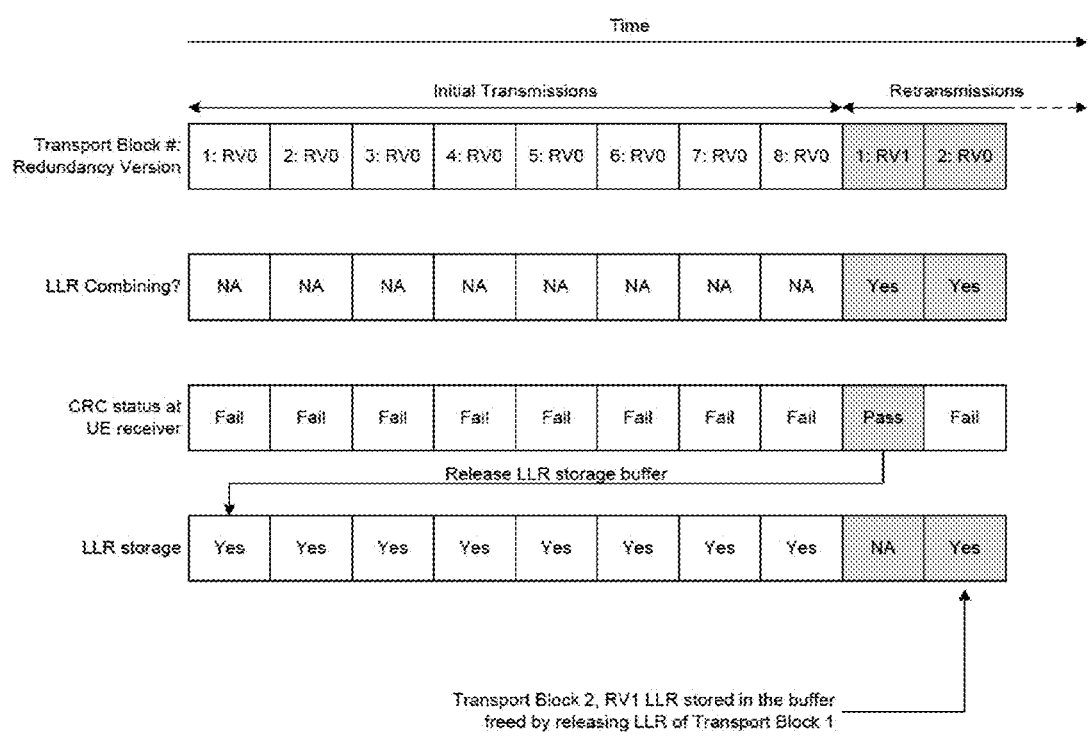
FIG. 10 illustrates an example operations performed at UE receiver when the buffer is not full and combining is performed with non-RV0 retransmissions and non-RV0 LLRs are saved according to the aspects of the present disclosure.

According to an aspect of the present disclosure, the UE receiver uses HARQ LLR storage that is less than the maximum required storage under the worst case scenario while simultaneously meeting the HARQ performance requirement in terms of Transport Block Error (BLER) rate and throughput. According to an aspect of the present disclosure, the UE receiver includes the buffer to store all the initial transmissions, i.e., RV0 bits which include almost all of the systematic bits, for all the Transport Blocks over the entire minimum HARQ RTT window as shown in FIG. 8. According to another aspect of the present disclosure, the UE receiver always uses LLRs from a retransmitted Code Block for decoding by combining them with previously stored LLRs from initial transmission (RV0) and attempts to decode the Code Block as shown in FIG. 8 for the retransmitted Transport Blocks. If the decoding fails after combining the LLR from initial transmission and the currently received retransmission, the UE receiver generates a CRC failure indication and sends a NACK to the eNB. According to another aspect of the present disclosure, if there is no more buffer space available for storing LLRs from the retransmitted Transport Block, the newly received LLRs from the retransmitted blocks are not stored if the LLRs are from a different Redundancy Version as shown in FIG. 8. According to another aspect of the present disclosure, if the newly received LLRs from the retransmitted blocks are from the same Redundancy Version as the one already stored in HARQ buffer, i.e., RV0, the newly received LLRs are combined with the previously stored LLRs and the combined LLRs are stored back in the same exact positions without requiring new storage as shown in FIG. 9. This improves the quality of the LLR without requiring new storage for the additional LLRs of different Redundancy Version of the same Code Block. If the decoding is successful (Code Block CRC pass), the LLR storage buffer corresponding to that Code Block is released as shown in FIG. 10.

The HARQ protocol in 3GPP LTE wireless communication system allows for up to four retransmissions in the downlink (eNB to UE direction). During each retransmission, the eNB may use a different Redundancy Version to improve the decoding performance. According to an aspect of the present disclosure, the UE is always able to store the LLRs from initial transmission (RV0) and able to combine with each one of the retransmissions. When the LLR buffer storage is limited, the combining of the LLRs from two or more retransmissions with the LLRs from initial transmission may not be done. According to an aspect of the present disclosure, whenever a buffer is available for storing the additional RVs of a Transport Block, it uses all the received RVs. This is illustrated in FIG. 10 where RV1 of a Transport Block 2 is stored in buffer. According to an aspect of the present disclosure, whenever an RV0 for a new transmission of Transport Block is to be stored and the buffer is full, the receiver may use the buffer used by replacing any previously received and stored non-RV0 LLRs of other Transport blocks.

Figure 11:
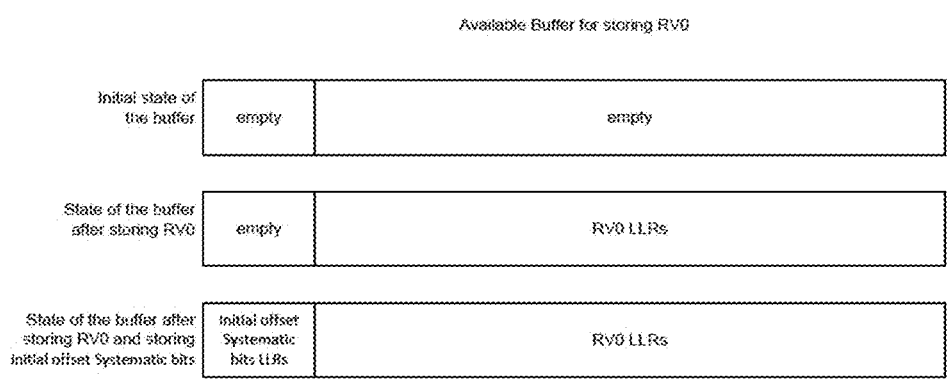
FIG. 11 illustrates an example operations performed at UE receiver when the RV0 buffer includes storage for the initial offset Systematic bits according to the aspects of the present disclosure.

According to an aspect of the present disclosure, the buffer storage for the RV0 may include additional buffer space for storing the initial offset Systematic bits, i.e., from the start of the buffer to the start of the RV0, that are not part of the RV0. When a retransmission for a Transport Block with a non-RV0 is received, and it includes the initial offset Systematic bits, the LLRs for these bits may be stored in the buffer for RV0 which includes additional space for these LLRs as illustrated in FIG. 11.

According to the aspects of the present disclosure, the storage requirement for LLRs may be determined by the highest code rate, for example the highest code rate for 3GPP LTE wireless communication system is approximately 0.93. With this code rate, for Category-4 UE which supports 150 Mbps data rate in the downlink, the LLR storage requirement is approximately 1290322 locations (150000 bits per subframe and eight subframes worth of LLRs need to be stored. For code rate of 0.93, the required storage is 150000*8/0.93≈1290322). This requirement is about 1827072−1290322=536750 fewer LLRs. If each LLR is stored in 6-bit representation, the reduction in memory is 536750*6 bits=3220500 bits, i.e., approximately 3 Mbits. This reduction is memory requirement is achieved while supporting the worst case scenario for throughput requirements and while maintaining almost the same BLER performance.

Figure 12:
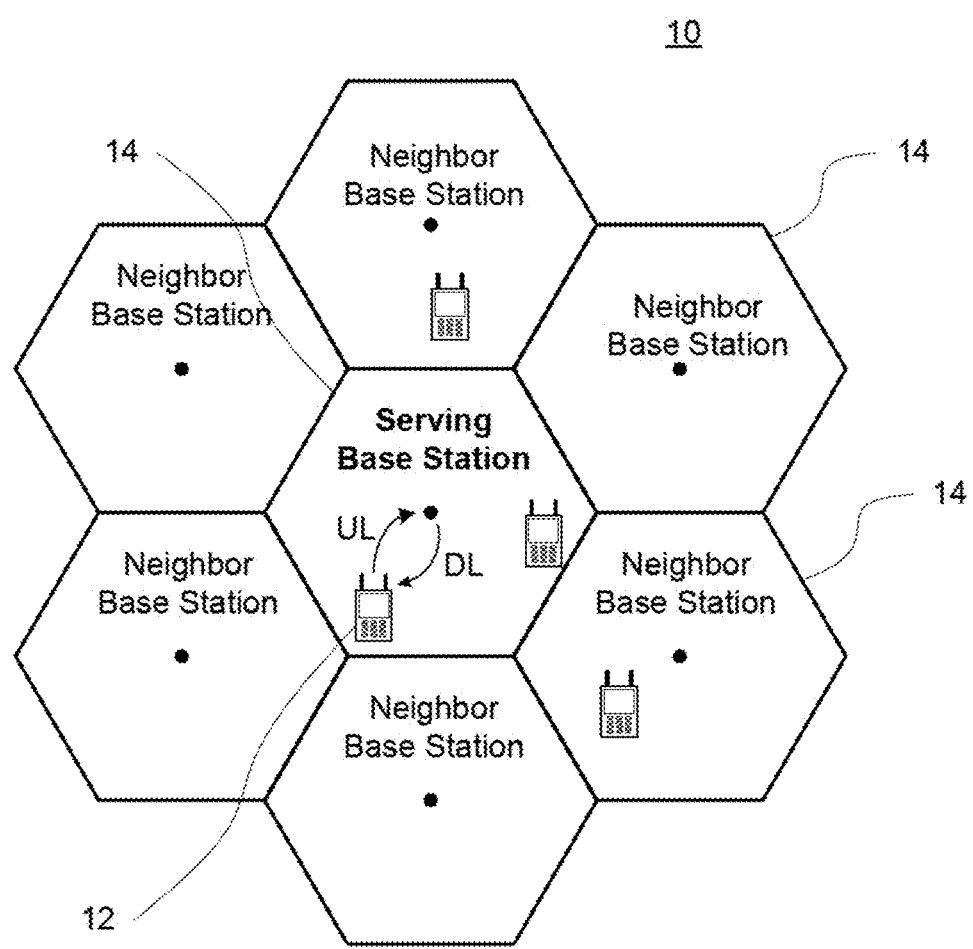
FIG. 12 illustrates a conventional wireless cellular communication system.

Typically, as shown in FIG. 12, a mobile communication system comprises elements such as client terminals or mobile stations and one or more base stations. Other network devices may also be employed, such as a mobile switching center (not shown). As illustrated in FIG. 12, the communication path from the base station (BS) to the client terminal or mobile station (MS) is referred to herein as a downlink (DL) direction or downlink channel, and the communication path from the client terminal to the base station is referred to herein as an uplink (UL) direction or uplink channel. In some mobile communication systems, the MS communicates with the BS in both the DL and UL directions. For instance, such communication is carried out in cellular telephone systems. In other wireless communication systems, the client terminal communicates with the base stations in only one direction, usually the DL. Such DL communication may occur in applications such as paging. As used herein, the terms "base station" and "network" are used interchangeably.

By way of example only, the above-described method may be implemented in a receiver, e.g., a user device such as a wireless mobile station (MS) 12 as shown in FIG. 12.

Figure 13:
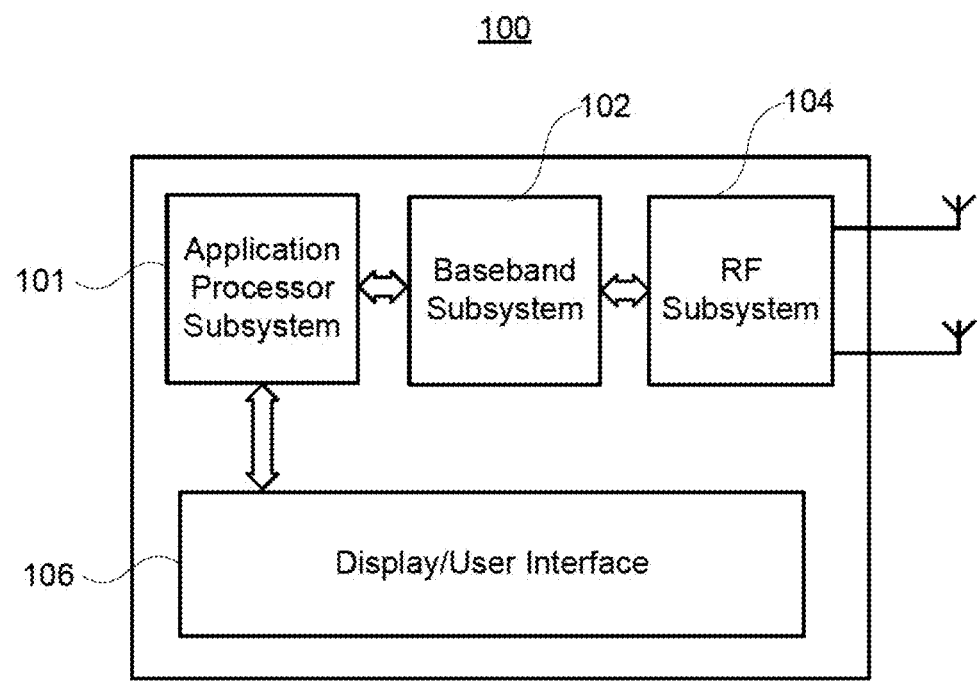
FIG. 13 illustrates a wireless mobile station diagram, which may be employed with aspects of the disclosure described herein.

As shown in FIG. 13, MS 100 may include an application processor subsystem 101, baseband subsystem 102 and a radio frequency (RF) subsystem 104 for use with a wireless communication network. A display/user interface 106 provides information to and receives input from the user. By way of example, the user interface may include one or more actuators, a speaker and a microphone. In some mobile devices, certain combination of the application processor subsystem 101, the baseband subsystem 102 and the RF subsystem 104 are all integrated as one integrated chip.

Figure 14:
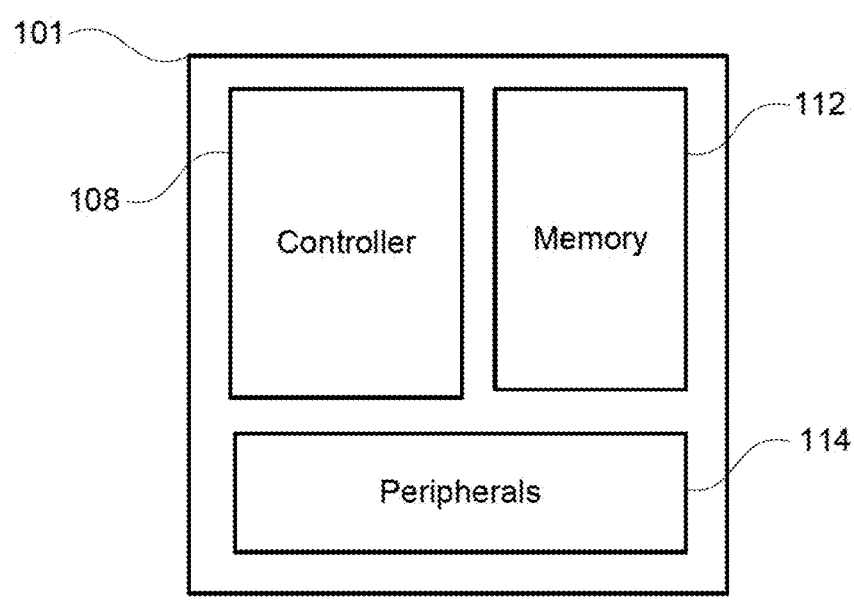
FIG. 14 illustrates an application processor subsystem for a wireless mobile station, which may be employed with aspects of the disclosure described herein.
Figure 15:
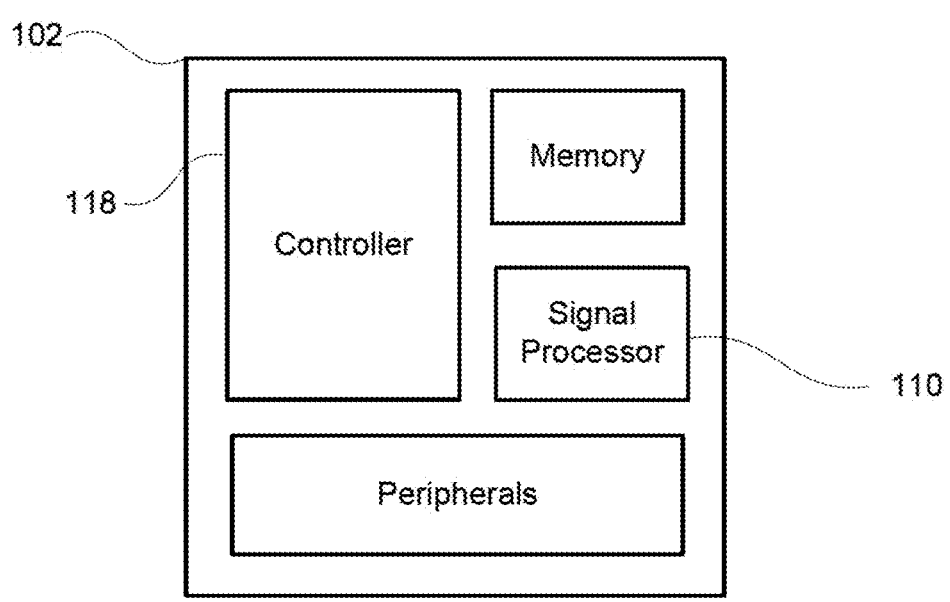
FIG. 15 illustrates a baseband subsystem for a wireless mobile station, which may be employed with aspects of the disclosure described herein.
Figure 16:
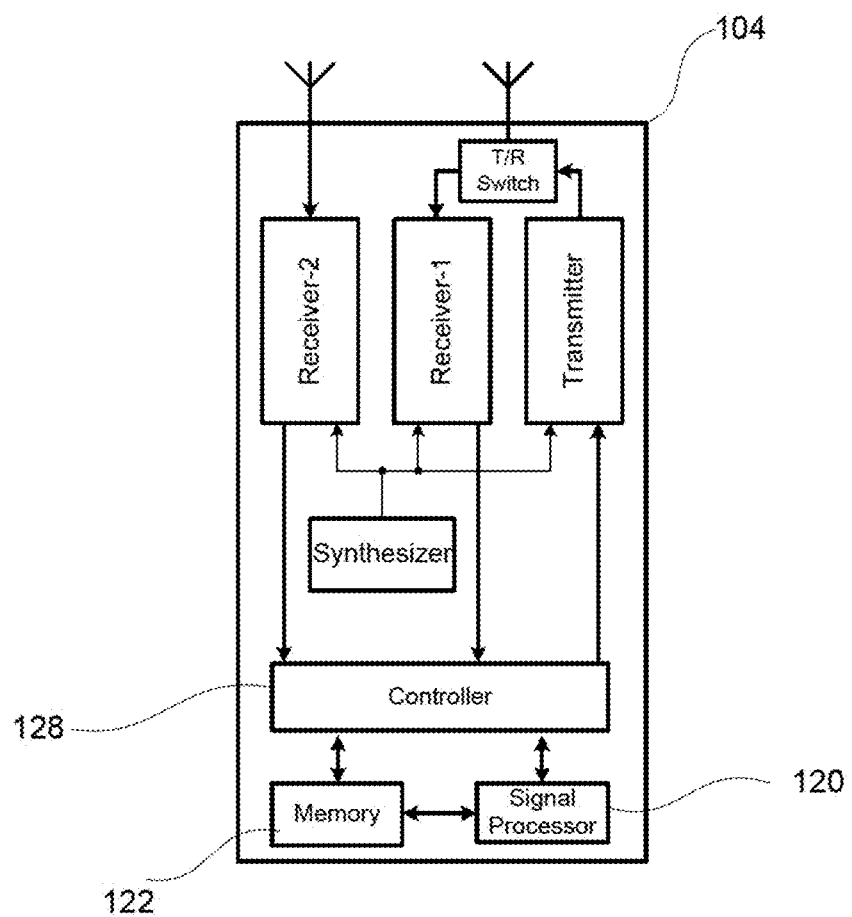
FIG. 16 illustrates an RF subsystem for a wireless mobile station, which may be employed with aspects of the disclosure described herein.

The application processor subsystem 101 as shown in FIG. 14 may include a controller 108 such as a microcontroller, another processor or other circuitry. The baseband subsystem 102 as shown in FIG. 15 may include a controller 118 such as a microcontroller or other processor. The RF subsystem 104 as shown in FIG. 16 may include a controller 128 such as a microcontroller, another processor or other circuitry. The controller 108 desirably handles overall operation of the MS 100. This may be done by any combination of hardware, software and firmware running on the controller 108. Such a combination of hardware, software and firmware may embody any methods in accordance with aspects of the present disclosure.

Peripherals 114 such as a full or partial keyboard, video or still image display, audio interface, etc may be employed and managed through the controller 108.

Aspects of the present disclosure may be implemented in firmware of the controller 108 of the application processor and/or the controller 118 of the baseband subsystem. In another alternative, aspects of the present disclosure may also be implemented as a combination of firmware and hardware of the application processor subsystem 101 and/or the baseband subsystem 102. For instance, a signal processing entity of any or all of the FIG. 15 may be implemented in firmware, hardware and/or software. It may be part of the baseband subsystem, the receiver subsystem or be associated with both subsystems. In one example, the controller 118 and/or the signal processor 110 may include or control the protocol entity circuitry. The software may reside in internal or external memory and any data may be stored in such memory. The hardware may be an application specific integrated circuit (ASIC), field programmable gate array (FPGA), discrete logic components or any combination of such devices. The terms controller and processor are used interchangeably herein.

The consumer electronics devices that may use the aspects of the disclosure may include smartphones, tablets, laptops, gaming consoles, cameras, video camcorders, TV, car entertainment systems, etc.

Although aspects of the disclosure herein have been described with reference to particular embodiments, it is to be understood that these embodiments are merely illustrative of the principles and applications of the aspects of the present disclosure. It is therefore to be understood that numerous modifications may be made to the illustrative embodiments and that other arrangements may be devised without departing from the spirit and scope of the aspects of the present disclosure as defined by the appended claims. Aspects of each embodiment may be employed in the other embodiments described herein.

The invention claimed is:

1. A method for storing, in a memory, Log Likelihood Ratios (LLR) for a Hybrid Automatic Repeat Request (HARQ) protocol in a communication system,
    wherein the memory has a size (i) less than a maximum size required by the HARQ protocol for a worst case Transport Block decoding condition at a communication device of the communication system, (ii) satisfying Transport Block Error (BLER) rate and throughput performance of the HARQ protocol, and (iii) to store all transmissions of initial Redundancy Versions (RV0) respectively for a predetermined number of Transport Blocks, and
    in which the RV0 transmissions respectively for the predetermined number of Transport Blocks include less than all systematic bits of the predetermined number of Transport Blocks,
    the method comprising:
    controlling, by a processing device,
        decoding of a first Code Block of a first Transport Block of the Transport Blocks by combining an LLR of a RV0 of the first Code Block of the first Transport Block for which decoding was unsuccessful with an LLR of a currently retransmitted Redundancy Version (RVI) of the first Code Block of the first Transport Block, in which the LLR of the RV0 of the first Code Block of the first Transport Block is stored in a first position of the memory corresponding to the first Transport Block,
        when the decoding of the first Code Block of the first Transport Block by the combining is unsuccessful, generating a redundancy check failure indication and transmitting a negative acknowledgement (NACK) to a base station of the system from which Redundancy Versions of the Code Blocks respectively of the Transport Blocks are transmitted,
        when space in the memory for storing the LLR of the RVI of the first Code Block of the first Transport Block is not available and a newly received LLR of the first Transport Block is from a Redundancy Version (RV) different from an RV for the first Transport Block stored in the memory, the newly received LLR of the first Transport Block not to be stored in the memory,
        when the newly received LLR of the first Transport Block is from a same RV as a given RV for the first Transport Block having a given LLR thereof stored in the memory, storing a result of combining the newly received LLR for the first Transport Block with the given LLR for the first Transport Block stored in the memory, at a position in the memory at which the given LLR corresponding to the first Transport Block is stored, and
        when decoding for the first Transport Block is successful, releasing the first position in the memory corresponding to the first Transport Block.

2. The method of claim 1,
    wherein the decoding of the Code Blocks respectively of the Transport Blocks includes a cyclic redundancy check (CRC).

3. The method of claim 1,
    controlling, by the processing device, when the first position in the memory corresponding to the first Transport Block has been released and a second position in the memory corresponding to a second Transport Block of the Transport Blocks is full, storing a currently retransmitted RVI for the second Transport Block in the first position in the memory.

4. The method of claim 1,
    controlling, by the processing device, the decoding of the first Code Block of the first Transport Block by combining the LLR of the RV0 of the first Code Block of the first Transport Block for which decoding was unsuccessful with the LLR of the currently retransmitted (RVI) of the first Code Block of the first Transport Block and an LLR of each previously retransmitted RVI of the first Code Block of the first Transport Block, in which the LLR of each previously retransmitted RVI of the first Code Block of the first Transport Block is stored at a respective position in the memory.

5. The method of claim 1,
    controlling, by the processing device, when a given position in the memory corresponding to a given Transport Block of the Transport Blocks has a size configured to store initial offset Systematic bits external to an RV0 for the given Transport Block and a retransmission RVI for the given Transport Block including the initial offset Systematic bits is received, storing an LLR for the initial offset Systematic bits in the given position in the memory corresponding to the given Transport Block which is storing an LLR for the RV0 of the given Transport Block.

6. The method of claim 1,
wherein the size of the memory is determined according to a highest code rate for the communication system, and
wherein the communication system is a $3^{rd}$ Generation Partnership Project (3GPP) Long Term Evolution (LTE) wireless communication system.

7. An apparatus for storing, in a memory, Log Likelihood Ratios (LLR) for a Hybrid Automatic Repeat Request (HARQ) protocol in a communication system,
wherein the memory has a size (i) less than a maximum size required by the HARQ protocol for a worst case Transport Block decoding condition at a communication device of the communication system, (ii) satisfying Transport Block Error (BLER) rate and throughput performance of the HARQ protocol, and (iii) to store all transmissions of initial Redundancy Versions (RV0) respectively for a predetermined number of Transport Blocks, and
in which the RV0 transmissions respectively for the predetermined number of Transport Blocks include less than all systematic bits of the predetermined number of Transport Blocks,
the apparatus comprising:
circuitry configured to control:
decoding of a first Code Block of a first Transport Block of the Transport Blocks by combining an LLR of a RV0 of the first Code Block of the first Transport Block for which decoding was unsuccessful with an LLR of a currently retransmitted Redundancy Version (RVI) of the first Code Block of the first Transport Block, in which the LLR of the RV0 of the first Code Block of the first Transport Block is stored in a first position of the memory corresponding to the first Transport Block,
when the decoding of the first Code Block of the first Transport Block by the combining is unsuccessful, generating a redundancy check failure indication and transmitting a negative acknowledgement (NACK) to a base station of the system from which Redundancy Versions of the Code Blocks respectively of the Transport Blocks are transmitted,
when space in the memory for storing the LLR of the RVI of the first Code Block of the first Transport Block is not available and a newly received LLR of the first Transport Block is from a Redundancy Version (RV) different from an RV for the first Transport Block stored in the memory, the newly received LLR of the first Transport Block not to be stored in the memory,
when the newly received LLR of the first Transport Block is from a same RV as a given RV for the first Transport Block having a given LLR thereof stored in the memory, storing a result of combining the newly received LLR for the first Transport Block with the given LLR for the first Transport Block stored in the memory, at a position in the memory at which the given LLR corresponding to the first Transport Block is stored, and
when decoding for the first Transport Block is successful, releasing the first position in the memory corresponding to the first Transport Block.

8. The apparatus of claim 7,
wherein the decoding of the Code Blocks respectively of the Transport Blocks includes a cyclic redundancy check (CRC).

9. The apparatus of claim 7,
wherein the circuitry is configured to control, when the first position in the memory corresponding to the first Transport Block has been released and a second position in the memory corresponding to a second Transport Block of the Transport Blocks is full, storing a currently retransmitted RVI for the second Transport Block in the first position in the memory.

10. The apparatus of claim 7,
wherein the circuitry is configured to control the decoding of the first Code Block of the first Transport Block by combining the LLR of the RV0 of the first Code Block of the first Transport Block for which decoding was unsuccessful with the LLR of the currently retransmitted (RVI) of the first Code Block of the first Transport Block and an LLR of each previously retransmitted RVI of the first Code Block of the first Transport Block, in which the LLR of each previously retransmitted RVI of the first Code Block of the first Transport Block is stored at a respective position in the memory.

11. The apparatus of claim 7,
wherein the circuitry is configured to control, when a given position in the memory corresponding to a given Transport Block of the Transport Blocks has a size configured to store initial offset Systematic bits external to an RV0 for the given Transport Block and a retransmission RVI for the given Transport Block including the initial offset Systematic bits is received, storing an LLR for the initial offset Systematic bits in the given position in the memory corresponding to the given Transport Block which is storing an LLR for the RV0 of the given Transport Block.

12. The apparatus of claim 7,
wherein the size of the memory is determined according to a highest code rate for the communication system, and
wherein the communication system is a $3^{rd}$ Generation Partnership Project (3GPP) Long Term Evolution (LTE) wireless communication system.

13. A communication device comprising:
a receiver to receive a signal in a communication system; and
a processing device to control storing, in a memory, Log Likelihood Ratios (LLR) for a Hybrid Automatic Repeat Request (HARQ) protocol in the communication system,
wherein the memory has a size (i) less than a maximum size required by the HARQ protocol for a worst case Transport Block decoding condition at the communication device, (ii) satisfying Transport Block Error (BLER) rate and throughput performance of the HARQ protocol, and (iii) to store all transmissions of initial Redundancy Versions (RV0) respectively for a predetermined number of Transport Blocks, and
in which the RV0 transmissions respectively for the predetermined number of Transport Blocks include less than all systematic bits of the predetermined number of Transport Blocks,
wherein the processing device is configured to control:
decoding of a first Code Block of a first Transport Block of the Transport Blocks by combining an LLR of a RV0 of the first Code Block of the first Transport Block for which decoding was unsuccessful with an LLR of a currently retransmitted Redundancy Version (RVI) of the first Code Block of the first Transport Block, in which the LLR of the RV0 of the first Code Block of the first Transport Block is stored in a first position of the memory corresponding to the first Transport Block, when the decoding of the first Code Block of the first Transport Block by the combining is unsuccessful, generating a redundancy check failure indication and transmitting a negative acknowledgement (NACK) to a base station of the system from which Redundancy Versions of the Code Blocks respectively of the Transport Blocks are transmitted, when space in the memory for storing the LLR of the RVI of the first Code Block of the first Transport Block is not available and a newly received LLR of the first Transport Block is from a Redundancy Version (RV) different from an RV for the first Transport Block stored in the memory, the newly received LLR of the first Transport Block not to be stored in the memory, when the newly received LLR of the first Transport Block is from a same RV as a given RV for the first Transport Block having a given LLR thereof stored in the memory, storing a result of combining the newly received LLR for the first Transport Block with the given LLR for the first Transport Block stored in the memory, at a position in the memory at which the given LLR corresponding to the first Transport Block is stored, and when decoding for the first Transport Block is successful, releasing the first position in the memory corresponding to the first Transport Block.

14. The communication device of claim 13, wherein the decoding of the Code Blocks respectively of the Transport Blocks includes a cyclic redundancy check (CRC).

15. The communication device of claim 13, wherein the circuitry is configured to control, when the first position in the memory corresponding to the first Transport Block has been released and a second position in the memory corresponding to a second Transport Block of the Transport Blocks is full, storing a currently retransmitted RVI for the second Transport Block in the first position in the memory.

16. The communication device of claim 13, wherein the circuitry is configured to control the decoding of the first Code Block of the first Transport Block by combining the LLR of the RV0 of the first Code Block of the first Transport Block for which decoding was unsuccessful with the LLR of the currently retransmitted (RVI) of the first Code Block of the first Transport Block and an LLR of each previously retransmitted RVI of the first Code Block of the first Transport Block, in which the LLR of each previously retransmitted RVI of the first Code Block of the first Transport Block is stored at a respective position in the memory.

17. The communication device of claim 13, wherein the circuitry is configured to control, when a given position in the memory corresponding to a given Transport Block of the Transport Blocks has a size configured to store initial offset Systematic bits external to an RV0 for the given Transport Block and a retransmission RVI for the given Transport Block including the initial offset Systematic bits is received, storing an LLR for the initial offset Systematic bits in the given position in the memory corresponding to the given Transport Block which is storing an LLR for the RV0 of the given Transport Block.

18. The communication device of claim 13, wherein the size of the memory is determined according to a highest code rate for the communication system, and wherein the communication system is a $3^{rd}$ Generation Partnership Project (3GPP) Long Term Evolution (LTE) wireless communication system.

* * * * *